United States Patent [19]
Itano et al.

[11] Patent Number: 6,087,050
[45] Date of Patent: Jul. 11, 2000

[54] RADIATION SENSITIVE COMPOSITION AND COLOR FILTER

[75] Inventors: Kouji Itano; Shigeru Abe; Hiroaki Nemoto; Atsushi Kumano, all of Mie, Japan

[73] Assignee: JSR Corporation, Tokyo, Japan

[21] Appl. No.: 09/084,312

[22] Filed: May 26, 1998

[30] Foreign Application Priority Data

May 28, 1997 [JP] Japan .................................. 9-153134

[51] Int. Cl.$^7$ .......................... G02B 5/20; G02F 1/1335; G02F 7/028
[52] U.S. Cl. ............................................. 430/7; 430/288.1
[58] Field of Search .......................... 430/7, 281.1, 288.1

[56] References Cited

U.S. PATENT DOCUMENTS

| | | | |
|---|---|---|---|
| 5,362,603 | 11/1994 | Yatoh et al. | 430/281.1 |
| 5,368,976 | 11/1994 | Tajima et al. | 430/176 |
| 5,866,298 | 2/1999 | Iwamoto et al. | 430/281.1 |

FOREIGN PATENT DOCUMENTS 0 539 606  5/1993  European Pat. Off. .

OTHER PUBLICATIONS

Derwent Abstracts, AN 83–738113, JP 58 115432, Jul. 9, 1983.
Derwent Abstracts, AN 94–338331, JP 06 263832, Sep. 20, 1994.

*Primary Examiner*—John A. McPherson
*Attorney, Agent, or Firm*—Oblon, Spivak, McClelland, Maier & Neustadt, P.C.

[57] ABSTRACT

A radiation sensitive composition comprising a colorant, a binder polymer, at least one esterified product selected from the group consisting of (c-1) an esterified product of a dicarboxylic acid and a free hydroxyl group-containing poly(meth)acrylate and (c-2) an esterified product of a polycarboxylic acid having at least three carboxyl groups and a monohydroxyalkyl (meth)acrylate and a photopolymerization initiator. A color filter is produced by photocuring the composition.

13 Claims, No Drawings

RADIATION SENSITIVE COMPOSITION AND COLOR FILTER

DETAILED DESCRIPTION OF THE INVENTION

This invention relates to a radiation sensitive composition for a color filter used in the production of a color filter to be used in color liquid crystal display devices, color image pick-up tube elements and the like.

A radiation sensitive composition is used to form a color filter to be used in color liquid crystal display devices, color image pick-up tube elements and the like. Since the composition is required to have high sensitivity, adhesion to the substrate, chemical resistance and the like, a negative radiation sensitive composition is generally used.

To form a color filter using the negative radiation sensitive composition, a pattern-shaped light screening layer is formed on a transparent substrate, and a negative radiation sensitive composition resin having a colorant dispersed therein is coated on the substrate, exposed to radiation through a photomask and developed to dissolve unexposed portions with a developer, thereby forming a pixel pattern. The three primary colors—red, green and blue—are used as the colorant.

As the above negative radiation sensitive composition having a colorant dispersed therein have been mainly used a composition comprising a resin containing an acid functional group such as (meth)acrylic acid, a polyfunctional monomer such as pentaerythritol tri(meth)acrylate and a photopolymerization initiator such as 1-hydroxycyclohexylphenyl ketone.

However, when a color filter is formed from such a negative radiation sensitive composition, a pixel portion cured by exposure to radiation swell with an alkali developer when development is carried out using the alkali developer, whereby the resolution of the obtained pixel pattern may lower or the pixel pattern may deform often. Particularly when a negative radiation sensitive composition having a colorant dispersed therein is used for electronics application in which a fine pixel array is formed on a silicon wafer as in a image pick-up tube element, such problems arise that scum forms on the obtained pixel pattern, the surface is roughened, or part of the pixel array is lost at the time of development with an alkali developer. Further, it is difficult to produce a high-resolution pixel array at a high yield. Moreover, the adhesion strength of a pixel pattern is lowered by development, and a pixel pattern peels off from the substrate when an alignment layer or transparent conductive film are formed after the formation of a pixel array.

As a solution to the above problems, there is proposed, for example, a chemically amplified negative radiation sensitive composition comprising a red pigment, polyvinylphenol, methylolmelamine and an optically acid generating agent such as 1,1-bis(p-chlorophenyl)-2,2,2-trichloroethane. A color filter obtained by using this composition has sufficiently high adhesion strength even in case of a fine pixel pattern.

However, when a fine pixel array is to be formed by using this chemically amplified negative radiation sensitive composition, undissolved portions (residues) of the composition may remain in an unexposed portion (non-pixel portion), or scum may form on a pixel at the time of development with an alkali developer.

Therefore, the development of a radiation sensitive composition for negative color filters has been desired that is able to form a high-resolution pixel array having excellent adhesion strength to a substrate, without having undissolved portions (residues) of the composition remaining in an unexposed portion or scum produced on a pixel even when a fine pixel array is to be formed.

In view of the above situation, it is an object of the present invention to provide a novel radiation sensitive composition, particularly a radiation sensitive composition advantageously used for color filters.

It is another object of the present invention to provide a radiation sensitive composition which is capable of forming a high-resolution pixel array having excellent adhesion strength to a substrate at a high yield without having undissolved portions (residues) of the composition remaining in an unexposed portion or scum produced on a pixel even when a fine pixel array is to be formed.

Other objects and advantages of the present invention will become apparent from the following description.

According to the present invention, the above objects and advantages of the present invention can be attained by a radiation sensitive composition comprising:

(A) a colorant;

(B) a binder polymer;

(C) at least one carboxyl group-containing polyfunctional monomer selected from the group consisting of (c-1) an esterified product of a dicarboxylic acid and a free hydroxyl group-containing poly(meth)acrylate which is a partially esterified product of a polyhydric alcohol having at least three hydroxyl groups and (meth)acrylic acid and (c-2) an esterified product of a polycarboxylic acid having at least three carboxyl groups and a monohydroxyalkyl (meth)acrylate; and (D) a photopolymerization initiator.

The present invention will be described in detail hereinafter.

(A) Colorant

The colorant in the present invention is not limited to a particular color tone and is suitably selected according to the application purpose of the obtained color filter. It may be either organic or inorganic.

Illustrative examples of the organic colorant include dyes, organic pigments, natural coloring matters and the like. Illustrative examples of the inorganic colorant include inorganic pigments, inorganic salts called "extender pigment" and the like.

Since high-definition color development and heat resistance are required for color filters, the colorant used in the present invention preferably has high color developing properties and high heat resistance, particularly preferably high resistance to thermal decomposition. An organic colorant is generally used, and an organic pigment is particularly preferably used.

Illustrative examples of the organic pigment include compounds classified into the group of pigments according to color index (C.I.; issued by The Society of Dyers and Colourists Co.) and having the following color index numbers, such as C.I. Pigment Yellow 1, C.I. Pigment Yellow 3, C.I. Pigment Yellow 12, C.I. Pigment Yellow 13, C.I. Pigment Yellow 14, C.I. Pigment Yellow 16, C.I. Pigment Yellow 17, C.I. Pigment Yellow 20, C.I. Pigment Yellow 24, C.I. Pigment Yellow 31, C.I. Pigment Yellow 55, C.I. Pigment Yellow 60, C.I. Pigment Yellow 65, C.I. Pigment Yellow 73, C.I. Pigment Yellow 74, C.I. Pigment Yellow 81, C.I. Pigment Yellow 83, C.I. Pigment Yellow 93, C.I. Pigment Yellow 95, C.I. Pigment Yellow 97, C.I. Pigment Yellow 98, C.I. Pigment Yellow 100, C.I. Pigment Yellow 101, C.I. Pigment Yellow 104, C.I. Pigment Yellow 106, C.I. Pigment Yellow 108, C.I. Pigment Yellow 109, C.I. Pigment Yellow 110, C.I. Pigment Yellow 113, C.I. Pigment Yellow 114, C.I. Pigment Yellow 116, C.I. Pigment Yellow 117, C.I. Pigment Yellow 119, C.I. Pigment Yellow 120, C.I. Pigment Yellow 126, C.I. Pigment Yellow 127, C.I. Pigment Yellow 128, C.I. Pigment Yellow 129, C.I. Pigment Yellow 138, C.I. Pigment Yellow 139, C.I. Pigment Yellow 150, C.I. Pigment Yellow 151, C.I. Pigment Yellow 152, C.I. Pigment Yellow 153, C.I. Pigment Yellow 154, C.I. Pigment Yellow 155, C.I. Pigment Yellow 156, C.I. Pigment Yellow 166, C.I. Pigment Yellow 168 and C.I. Pigment Yellow 175; C.I. Pigment Orange 36, C.I. Pigment Orange 43, C.I. Pigment Orange 51, C.I. Pigment Orange 61, C.I. Pigment Orange 71 and C.I. Pigment Orange 73; C.I. Pigment Red 9, C.I. Pigment Red 88, C.I. Pigment Red 97, C.I. Pigment Red 122, C.I. Pigment Red 123, C.I. Pigment Red 149, C.I. Pigment Red 168, C.I. Pigment Red 176, C.I. Pigment Red 177, C.I. Pigment Red 180, C.I. Pigment Red 209, C.I. Pigment Red 215, C.I. Pigment Red 224, C.I. Pigment Red 242, C.I. Pigment Red 254, C.I. Pigment Red 255 and C.I. Pigment Red 265; C.I. Pigment Violet 19, C.I. Pigment Violet 23 and C.I. Pigment Violet 29; C.I. Pigment Blue 15, C.I. Pigment Blue 15:3, C.I. Pigment Blue 15:4, C.I. Pigment Blue 15:6 and C.I. Pigment Blue 60; C.I. Pigment Green 7 and C.I. Pigment Green 36; C.I. Pigment Brown 23 and C.I. Pigment Brown 25; and C.I. Pigment Black 1 and C.I. Pigment Black 7.

Illustrative examples of the inorganic colorant include titanium oxide, barium sulfate, calcium carbonate, zinc oxide, lead sulfate, yellow lead, zinc yellow, red iron oxide (III), cadmium red, ultramarine blue, Prussian blue, chromium oxide green, cobalt green, amber, titanium black, synthetic iron black, carbon black and the like.

These colorants may be used alone or in admixture of two or more.

(B) Binder polymer

Any appropriate polymers can be used as the binder polymer in the present invention as long as they serve as a binder for a colorant and are soluble in an alkali developer used in the development step of the color filter production process.

The binder polymer is preferably a polymer containing an acid functional group such as carboxyl group or phenolic hydroxyl group.

The binder polymer used in the present invention is preferably a polymer containing a carboxyl group, particularly preferably a copolymer (to be simply referred to as "carboxyl group-containing copolymer" hereinafter) of an ethylenically unsaturated monomer having at least one carboxyl group in a molecule (to be simply referred to as "carboxyl group-containing unsaturated monomer" hereinafter) and other copolymerizable ethylenically unsaturated monomer (to be simply referred to as "other unsaturated monomer" hereinafter).

Illustrative examples of the carboxyl group-containing unsaturated monomer include unsaturated monocarboxylic acids such as acrylic acid, methacrylic acid, crotonic acid, α-chloroacrylic acid, ethacrylic acid, cinnamic acid, ω-carboxy-polycaprolactone monoacrylate (trade name: M-5300, a product of TOA GOSEI CO.,LTD), ω-carboxy-polycaprolactone monomethacrylate; unsaturated dicarboxylic acids (anhydrides) such as 2-acryloyloxyethylsuccinic acid (trade name: HOA-MS, a product of KYOEISHA CHEMICAL CO.,LTD), 2-methacryloyloxyethylsuccinic acid, maleic acid, maleic anhydride, fumaric acid, itaconic acid, itaconic anhydride, citraconic acid, citraconic anhydride and mesaconic acid; unsaturated polycarboxylic acids (anhydrides) having at least three hydroxyl groups; and the like.

These carboxyl group-containing unsaturated monomers may be used alone or in admixture of two or more.

Illustrative examples of the other unsaturated monomer include aromatic vinyl compounds such as styrene, α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, p-vinylbenzyl methyl ether and p-vinylbenzyl glycidyl ether; unsaturated carboxylic acid esters such as methyl acrylate, methyl methacrylate, ethyl acrylate, ethyl methacrylate, n-propyl acrylate, i-propyl acrylate, n-propyl methacrylate, i-propyl methacrylate, n-butyl acrylate, i-butyl acrylate, sec-butyl acrylate, t-butyl acrylate, n-butyl methacrylate, i-butyl methacrylate, sec-butyl methacrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, glycerol acrylate, glycerol methacrylate, allyl acrylate, allyl methacrylate, benzyl acrylate, benzyl methacrylate, methoxytriethylene glycol acrylate (trade name: MTG-A, a product of KYOEISHA CHEMICAL CO.,LTD) and methoxytriethylene glycol methacrylate; unsaturated carboxylic acid aminoalkyl esters such as 2-aminoethyl acrylate, 2-aminoethyl methacrylate, 2-aminopropyl acrylate, 2-aminopropyl methacrylate; unsaturated carboxylic acid glycidyl esters such as glycidyl acrylate and glycidyl methacrylate; carboxylic acid vinyl esters such as vinyl acetate, vinyl propionate, vinyl butyrate and vinyl benzoate; unsaturated ethers such as vinylmethyl ether, vinylethyl ether, allyl glycidyl ether and methallyl glycidyl ether; vinyl cyanide compounds such as acrylonitrile, methacrylonitrile, α-chloroacrylonitrile and vinylidene cyanide; unsaturated amides such as acrylamide, methacrylamide, α-chloroacrylamide, N-(2-hydroxyethyl) acrylamide, N-(2-hydroxyethyl)methacrylamide, meleimide, N-phenylmaleimide and N-cyclohexylmaleimide; aliphatic conjugated dienes such as 1,3-butadiene, isoprene and chloroprene; macromonomers having a monoacryloyl group or monomethacryloyl group at the terminal of a polymer molecular chain such as polystyrene, polymethyl acrylate, polymethyl methacrylate, poly-n-butyl acrylate, poly-n-butyl methacrylate and polysiloxane; and the like.

These other unsaturated monomers may be used alone or in admixture of two or more.

The proportion of the carboxyl group-containing unsaturated monomer in the carboxyl group-containing copolymer is generally 5 to 50 wt %, preferably 10 to 40 wt %. When the proportion of the carboxylic group-containing unsaturated monomer is less than 5 wt %, the solubility in an alkali developer of the obtained radiation sensitive composition is apt to lower, while when the proportion is more than 50 wt %, the formed pixel pattern tends to fall off from the substrate or the film surface of the pixel is liable to be roughened at the time of development with an alkali developer.

Particularly, a carboxyl group-containing copolymer containing a carboxyl group-containing unsaturated monomer in the above specific proportion has excellent solubility in an alkali developer. In a radiation sensitive composition comprising the copolymer as a binder, undissolved portions rarely remain after development with an alkali development, and surface stains, resin residues or the like are hardly produced in an area other than a portion(s) where pixels are formed, of the substrate. Moreover, a pixel pattern obtained from the composition does not dissolve in an alkali developer excessively, has excellent adhesion to the substrate and does not fall off from the substrate.

The carboxyl group-containing copolymer in the present invention is preferably a copolymer (to be referred to as "carboxyl group-containing copolymer (b)" hereinafter) of (1) acrylic acid and/or methacrylic acid and (2) at least one other unsaturated monomer selected from the group consisting of methyl methacrylate, 2-hydroxyethyl acrylate, 2-hydroxyethyl methacrylate, benzyl acrylate, benzyl methacrylate, styrene, N-phenylmaleimide, polystyrene macromonomer and polymethyl methacrylate macromonomer.

Preferred examples of the carboxyl group-containing copolymer (b) include acrylic acid/benzyl acrylate copolymer; acrylic acid/benzyl acrylate/styrene copolymer; acrylic acid/methyl acrylate/styrene copolymer; acrylic acid/benzyl acrylate/polystyrene macromonomer copolymer; acrylic acid/benzyl acrylate/polymethyl methacrylate macromonomer copolymer; acrylic acid/methyl acrylate/polystyrene macromonomer copolymer; acrylic acid/methyl acrylate/polymethyl methacrylate macromonomer copolymer; acrylic acid/benzyl methacrylate copolymer; acrylic acid/benzyl methacrylate/styrene copolymer; acrylic acid/methyl methacrylate/styrene copolymer; acrylic acid/benzyl methacrylate/polystyrene macromonomer copolymer; acrylic acid/benzyl methacrylate/polymethyl methacrylate macromonomer copolymer; acrylic acid/methyl methacrylate/polystyrene macromonomer copolymer; acrylic acid/methyl methacrylate/polymethyl methacrylate macromonomer copolymer; acrylic acid/2-hydroxyethyl methacrylate/benzyl methacrylate/polystyrene macromonomer copolymer; acrylic acid/2-hydroxyethyl methacrylate/benzyl methacrylate/polymethyl methacrylate macromonomer copolymer; methacrylic acid/benzyl acrylate copolymer; methacrylic acid/benzyl acrylate/styrene copolymer; methacrylic acid/methyl acrylate/styrene copolymer; methacrylic acid/benzyl/polystyrene macromonomer copolymer; methacrylic acid/benzyl acrylate/polymethyl methacrylate macromonomer copolymer; methacrylic acid/methyl acrylate/polystyrene macromonomer copolymer; methacrylic acid/methyl acrylate/polymethyl methacrylate macromonomer copolymer; methacrylic acid/benzyl methacrylate copolymer; methacrylic acid/benzyl methacrylate/styrene copolymer; methacrylic acid/methyl methacrylate/styrene copolymer; methacrylic acid/benzyl methacrylate/polystyrene macromonomer copolymer; methacrylic acid/benzyl methacrylate/polymethyl methacrylate macromonomer copolymer; methacrylic acid/methyl methacrylate/polystyrene macromonomer copolymer; methacrylic acid/methyl methacrylate/polymethyl methacrylate macromonomer copolymer; methacrylic acid/2-hydroxyethyl methacrylate/benzyl methacrylate/polystyrene macromonomer copolymer; methacrylic acid/2-hydroxyethyl methacrylate/benzyl methacrylate/polymethyl methacrylate macromonomer copolymer; N-phenylmaleimide/methacrylic acid/styrene/benzyl methacrylate copolymer; N-phenylmaleimide, methacrylic acid/styrene/phenyl methacrylate copolymer; N-phenylmaleimide/methacrylic acid/styrene/benzyl methacrylate/polystyrene macromonomer copolymer; N-phenylmaleimide/methacrylic acid/styrene/benzyl methacrylate/polymethyl methacrylate macromonomer copolymer; N-phenylmaleimide/methacrylic acid/styrene/ phenyl methacrylate/polystyrene macromonomer copolymer; N-phenylmaleimide/methacrylic acid/styrene/phenyl methacrylate/polymethyl methacrylate macromonomer copolymer; N-phenylmaleimide/methacrylic acid/styrene/2-hydroxyethyl methacrylate/benzyl methacrylate/polystyrene macromonomer copolymer; N-phenylmaleimide/methacrylic acid/styrene/2-hydroxyethyl methacrylate/benzyl methacrylate/polymethyl methacrylate macromonomer copolymer; N-phenylmaleimide/methacrylic acid/styrene/2-hydroxyethyl methacrylate/phenyl methacrylate/polystyrene macromonomer; and N-phenylmaleimide/methacrylic acid/styrene/2-hydroxyethyl methacrylate/phenyl methacrylate/polymethyl methacrylate macromonomer copolymer, and the like.

Of these carboxyl group-containing copolymers (b), particularly preferred are methacrylic acid/benzyl methacrylate copolymer; methacrylic acid/benzyl methacrylate/styrene copolymer; methacrylic acid/methyl methacrylate/styrene copolymer; methacrylic acid/benzyl methacrylate/polystyrene macromonomer copolymer; methacrylic acid/benzyl methacrylate/polymethyl methacrylate macromonomer copolymer; methacrylic acid/methyl methacrylate/polystyrene macromonomer copolymer; methacrylic acid/methyl methacrylate/polymethyl methacrylate macromonomer copolymer; methacrylic acid/2-hydroxyethyl methacrylate/benzyl methacrylate/polystyrene macromonomer copolymer and methacrylic acid/2-hydroxyethyl methacrylate/benzyl methacrylate/polymethyl methacrylate macromonomer copolymer.

These carboxyl group-containing copolymers (b) may be used alone or in admixture of two or more. They may also be used in combination of at least one other binder polymer as the case may be.

The binder polymer preferably has a weight average molecular weight in terms of polystyrene measured by a gel permeation chromatography (GPC: tetrahydrofuran as an eluation solvent) (to be simply referred to as "weight average molecular weight" hereinafter) of 3,000 to 300,000, more preferably 5,000 to 100,000.

By using the binder polymer having this specific weight average molecular weight, a radiation sensitive composition having excellent developability can be obtained, pixel arrays having a sharp pattern edge can be formed thereby, and surface stains, resin residues or the like are hardly produced in an area other than a portion(s) where pixels are formed, of the substrate at the time of development.

The amount of the binder polymer used in the present invention is generally 10 to 1,000 parts by weight, preferably 20 to 500 parts by weight, based on 100 parts by weight of the colorant (A). When the amount of the binder polymer is less than 10 parts by weight, alkali developability may deteriorate, or surface stains or resin residues may be produced in an area other than a portion(s) where pixels are formed. On the other hand, when the amount is more than 1,000 parts by weight, it may be difficult to have the resulting thin film achieve a target color density due to a relative reduction in the concentration of the colorant.

(C) Carboxyl group-containing polyfunctional monomer

The carboxyl group-containing polyfunctional monomer in the present invention comprises at least one monomer selected from the group consisting of the following (c-1) and (c-2). These monomers have at least two polymerizable ethylenically unsaturated bonds.

(c-1) is an esterified product of a dicarboxylic acid and a free hydroxyl group-containing poly(meth)acrylate which is a partially esterified product of a polyhydric alcohol having at least three hydroxyl groups and (meth)acrylic acid, and (c-2) is an esterified product of a polycarboxylic acid having at least three carboxyl groups and a monohydroxyalkyl (meth)acrylate.

Stated more specifically, the carboxyl group-containing polyfunctional monomer includes at least one monomer selected from (c-1) a free carboxyl group-containing monoesterified product of a partially esterified product comprising a monohydroxyoligo (meth)acrylate such as trimethylolpropane diacrylate, trimethylolpropane dimethacrylate, pentaerythritol triacrylate, pentaerythritol trimethacrylate, dipentaerythritol pentaacrylate or dipentaerythritol pentamethacrylate and a dicarboxylic acid such as malonic acid, succinic acid, glutaric acid or terephthalic acid; and (c-2) a free carboxyl group-containing oligoesterified product of a polycarboxylic acid having at least three hydroxyl groups such as propane-1,2,3-tricarboxylic acid (tricarballylic acid), butane-1,2,4-tricarboxylic acid, benzene-1,2,3-tricarboxylic acid, benzene-1,3,4-tricarboxylic acid, benzene-1,3,5-tricarboxylic acid and a monohydroxy mono(meth)acrylate such as 2-hydroxyethyl acrylate, 2-hydroxyethyl methacrylate, 2-hydroxypropyl acrylate or 2-hydroxypropyl methacrylate.

Of these carboxyl group-containing polyfunctional monomers, particularly preferred are a free carboxyl group-containing monoesterified product of pentaerythritol triacrylate and succinic acid (to be referred to as "carboxyl group-containing polyfunctional monomer (c1)" hereinafter) and a free carboxyl group-containing monoesterified product of pentaerythritol trimethacrylate and succinic acid (to be referred to as "carboxyl group-containing polyfunctional monomer (c2)" hereinafter).

The carboxyl group-containing polyfunctional monomer (c1) has a structure represented by the following formula.

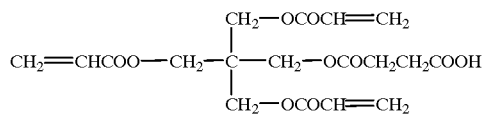

The carboxyl group-containing polyfunctional monomer (c2) has a structure represented by the following formula.

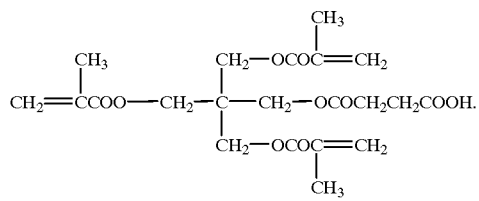

Both of the above carboxyl group-containing polyfunctional monomers (c1) and (c2) can provide a radiation sensitive composition which has a high pixel strength and an excellent smooth pixel surface and which hardly produces surface stains or resin residues in an area other than a portion(s) where pixels are formed.

The above carboxyl group-containing polyfunctional monomers may be used alone or in admixture of two or more.

The amount of the carboxyl group-containing polyfunctional monomer used in the present invention is generally 5 to 500 parts by weight, preferably 20 to 300 parts by weight, based on 100 parts by weight of the binder polymer. When the amount of the carboxyl group-containing polyfunctional monomer used is less than 5 parts by weight, the pixel strength and the smoothness of the pixel surface are liable to deteriorate, while when the amount is more than 500 parts by weight, alkali developability is apt to lower, or surface stains or resin residues are readily produced in an area other than a portion(s) where pixels are formed.

In the present invention, part of the above carboxyl group-containing polyfunctional monomer may be substituted by other polyfunctional monomer and/or a monofunctional monomer having one polymerizable ethylenically unsaturated bond, as long as a desired effect is obtained.

Illustrative examples of the other polyfunctional monomer include diacrylates and dimethacrylates of alkylene glycols such as ethylene glycol and propylene glycol; diacrylates and dimethacrylates of polyalkylene glycols such as polyethylene glycol and polypropylene glycol; oligoacrylates and oligomethacrylates of polyhydric alcohols having at least three hydroxyl groups such as glycerine, trimethylolpropane, pentaerythritol and dipentaerythritol; oligoacrylates and oligomethacrylates such as polyesters, epoxy resins, urethane resins, alkyd resins, silicone resins and spiran resins; diacrylates and dimethacrylates of both terminal hydroxylated polymers such as polybutadiene having hydroxyl groups at both terminals, polyisoprene having hydroxyl groups at both terminals and polycaprolactone having hydroxyl groups at both terminals; trisacryloyloxyethyl phosphate, trimethacryloyloxyethyl phosphate, and the like.

These polyfunctional monomers may be used alone or in admixture of two or more.

The amount of the other polyfunctional monomer used is generally 0 to 200 parts by weight, preferably 50 to 150 parts by weight, based on 100 parts by weight of the total of the carboxyl group-containing polyfunctional monomer and the other polyfunctional monomer.

The above monofunctional monomer is not limited to a particular kind. Preferred examples of the monofunctional monomer include ω-carboxy-polycaprolactone monoacrylate, ω-carboxy-polycaprolactone monomethacrylate, 2-acryloyloxyethylsuccinic acid, 2-methacryloyloxyethylsuccinic acid, 2-acryloyloxypropylsuccinic acid, 2-methacryloyloxypropylsuccinic acid, methoxyethylene glycol acrylate, methoxyethylene glycol methacrylate, methoxydiethylene glycol acrylate, methoxydiethylene glycol methacrylate, methoxytriethylene glycol acrylate, methoxytriethylene glycol methacrylate, methoxypropylene glycol acrylate, methoxypropylene glycol methacrylate, methoxydipropylene glycol acrylate, methoxydipropylene glycol methacrylate, 2-hydroxy-3-phenoxypropyl acrylate, 2-hydroxy-3-phenoxypropyl methacrylate and the like, in addition to the same monofunctional monomers as those listed for the other unsaturated monomer in the binder polymer (B). 2-Acryloyloxyethylsuccinic acid (trade name: M-5300) is also included as a commercial product.

These monofunctional monomers may be used alone or in admixture of two or more.

The amount of the monofunctional monomer used is generally 0 to 90 parts by weight, preferably 0 to 50 parts by weight, based on 100 parts by weight of the carboxyl group-containing polyfunctional monomer and the other polyfunctional monomer.

(D) Photopolymerization initiator

The term "photopolymerization initiator" as used in the present invention means a compound which produces active species capable of initiating the polymerization of the carboxyl group-containing polyfunctional monomer (C), such as radical, cationic and anionic species, due to the cleavage of a bonding group or decomposition caused by exposure.

This photopolymerization initiator is a compound having a biimidazole ring, compound having a benzoin bond, other photoradical generating agent, compound having a trihalomethyl group, or the like.

Illustrative examples of the compound having a biimidazole ring include compounds represented by the following general formula (1) (to be referred to as "biimidazole compounds (1)" hereinafter):

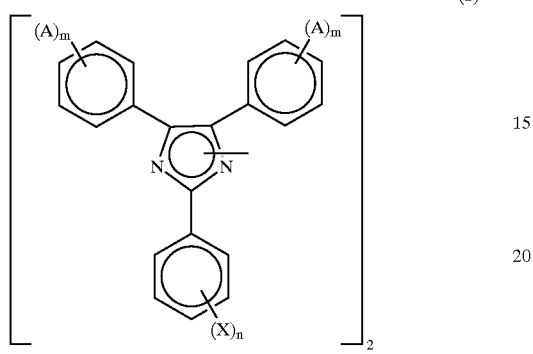

(1)

wherein X is a hydrogen atom, a halogen atom, a cyano group, an alkyl group having 1 to 4 carbon atoms and an aryl group having 6 to 9 carbon atoms, A is —COO—R (in which R is an alkyl group having 1 to 4 carbon atoms or an aryl group having 6 to 9 carbon atoms), m is an integer of 1 to 3, and n is an integer of 1 to 3, compounds represented by the following general formula (2) (to be referred to as "biimidazole compounds (2)" hereinafter):

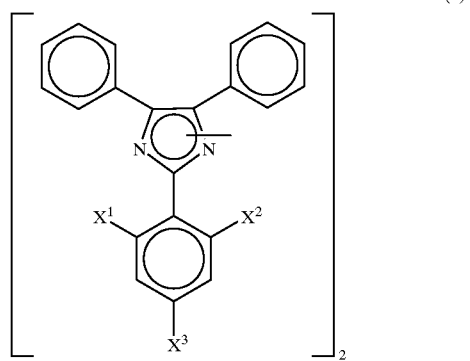

(2)

wherein $X^1$, $X^2$ and $X^3$ may be the same or different and are each a hydrogen atom, a halogen atom, a cyano group, an alkyl group having 1 to 4 carbon atoms or an aryl group having 6 to 9 carbon atoms, provided that two or more of $X^1$, $X^2$ and $X^3$ cannot be a hydrogen atom at the same time, and the like.

The above general formulas (1) and (2) generally indicate a structure in which two imidazole units are combined at the 1-position or 2-position. Therefore, the biimidazole compounds (1) and the biimidazole compounds (2) are a compound having a main skeleton represented by any one of the following formulas (3) to (5) or a mixture of two or more of the compound.

(3)

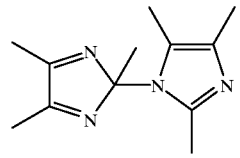

(4)

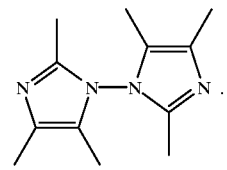

(5)

In the general formulas (1) and (2), illustrative examples of the halogen atom represented by X, $X^1$, $X^2$ and $X^3$ include chlorine atom, bromine atom, iodine atom and the like, illustrative examples of the alkyl group having 1 to 4 carbon atoms include methyl group, ethyl group, n-propyl group, i-propyl group, n-butyl group, i-butyl group, sec-butyl group, t-butyl group and the like, and illustrative examples of the aryl group having 6 to 9 carbon atoms include phenyl group, o-tolyl group, m-tolyl group, p-tolyl group and the like.

In the general formula (1), R in —COO—R represented by A is the same as an alkyl group having 1 to 4 carbon atoms or aryl group having 6 to 9 carbon atoms, as listed for X.

The biimidazole compounds (1) and the biimidazole-based compounds (2) include the following compounds.

The biimidazole compounds (1) include, for example, 2,2'-bis(2-chlorophenyl)-4,4',5,5'-tetrakis(4-ethoxycarbonylphenyl)-1,2'-biimidazole, 2,2'-bis(2-chlorophenyl)-4,4',5,5'-tetrakis(4-phenoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-cyanophenyl)-4,4,'5,5'-tetrakis(4-ethoxycarbonylphenyl)-1,2'-biimidazole, 2,2'-bis(2-cyanophenyl)-4,4',5,5'-tetrakis(4-phenoxycarbonylphenyl)-1,2'-biimidazole, 2,2'-bis(2-methylphenyl)-4,4,'5,5'-tetrakis(4-methoxycarbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methylphenyl)-4,4',5,5'-tetrakis(4-phenoxycarbonylphenyl)-1,2'-biimidazole, 2,2'-bis(2-ethylphenyl)-4,4',5,5'-tetrakis(4-methoxycarbonylphenyl)-1,2'-biimidazole, 2,2'-bis(2-ethylphenyl)- 4,4',5,5'-tetrakis(4-ethoxycarbonylphenyl)-1,2'-biimidazole, 2,2'-bis(2-ethylphenyl)-4,4',5,5'-tetrakis(4-phenoxycarbonylphenyl)-1,2'-biimidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis(2-phenylphenyl)-4,4',5,5'-tetrakis(4-phenoxycarbonylphenyl)-1,2'-biimidazole, and the like.

The biimidazole compounds (2) include, for example, 2,2'-bis(2,4-dichlorophenyl)-4,4',5,5'-tetraphenyl-1,2'- biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2,4-dimethylphenyl)-4,4',5,5'-tetraphenyl-1,2'-biimidazole, 2,2'-bis(2,4,6-trimethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1,2'-biimidazole, 2,2'-bis(2,4-diphenylphenyl)-4,4',5,5'-tetraphenyl-1,2'-biimidazole, 2,2'-bis(2,4,6-triphenylphenyl)-4,4',5,5'-tetraphenyl-1,2'-biimidazole, and the like.

Of the above biimidazole compounds (1), 2,2-bis(2-chlorophenyl)-4,4',5,5'-tetrakis(4-ethoxycarbonylphenyl)-1,2'-biimidazole and 2,2'-bis(2-bromophenyl)-4,4',5,5'-tetrakis(4-ethoxycarbonyphenyl)-1,2'-biimidazole are particularly preferred. Of the above biimidazole compounds (2), 2,2'-bis(2,4-dichlorophenyl)-4,4',5,5'-tetraphenyl-1,2'-biimidazole, 2,2'-bis(2,4-dibromophenyl)- 4,4',5,5'-tetraphenyl-1,2'-biimidazole, 2,2'-bis(2,4,6-trichlorophenyl)-4,4',5,5'-tetraphenyl-1,2'-biimidazole and 2,2'-bis(2,4,6-tribromophenyl)-4,4',5,5'-tetraphenyl-1,2'-biimidazole are particularly preferred.

The biimidazole compounds (1) and the biimidazole compounds (2) have excellent solubility in a solvent and rarely produces foreign matters such as undissolved matters and deposits. In addition, they have high sensitivity, promote a curing reaction to a sufficient degree by exposure to radiation of a small amount of energy, provide high contrast and do not cause a curing reaction in an unexposed portion (s). Therefore, the coating film after exposure to radiation is clearly divided into cured portions insoluble in a developer and uncured portions highly soluble in the developer, thereby making it possible to form an excellent color filter free from a partial or complete loss or undercut of a pattern.

In the present invention, each of the biimidazole compounds (1) and the biimidazole compounds (2) may be used alone or in admixture of two or more, or they may be used in combination.

Illustrative examples of the compound having a benzoin bond and other photoradical generating agent include 2-hydroxy-2-methyl-1-phenylpropane-1-one, 1-(4-isopropylphenyl)-2-hydroxy-2-methylpropane-1-one, 4-(2-hydroxyethoxy)phenyl-(2-hydroxy-2-propyl)ketone, 1-hydroxycyclohexylphenylketone, 2,2-dimethoxy-2-phenylacetophenone, 2-methyl-(4-methylthiophenyl)-2-morpholino-1-propane-1-one, 2-benzyl-2-dimethylamino-1-(4-morpholinophenyl)butane-1-one, benzophenone, 2,4-diethylthioxanthone, 3,3-dimethyl-4-methoxybenzophenone, 4-azidobenzaldehyde, 4-azidoacetophenone, 4-azidobenzalacetophenone, azidopyrene, 4-diazodiphenylamine, 4-diazo-4'-methoxydiphenylamine, 4-diazo-3-methoxydiphenylamine, bis(2,6-dimethoxybenzoyl)-2,4,4-trimethylpentylphosphine oxide, dibenzoyl, benzoinisobutyl ether, N-phenylthioacridone, triphenylpyrylium perchlorate and the like.

These compounds having a benzoin bond and other photoradical generating agents may be used alone or in admixture of two or more.

Illustrative examples of the compound having a trihalomethyl group include 2,4,6-tris(trichloromethyl)-s-triazine, 2-(2'-chlorophenyl)-4,6-bis(trichloromethyl)-s-triazine, 2-(4'-chlorophenyl)-4,6-bis(trichloromethyl)-s-triazine, 2-(2'-methoxyphenyl)-4,6-bis(trichloromethyl)-s-triazine, 2-(4'-methoxyphenyl)-4,6-bis(trichloromethyl)-s-triazine and the like.

These compounds having a trihalomethyl group may be used alone or in admixture of two or more.

Of the above compounds having a benzoin bond, other photoradical generating agents and compounds having a trihalomethyl group, 2-hydroxy-2-methyl-1-phenylpropane-1-one, 2-methyl-(4-methylthiophenyl)-2-morpholino-1-propane-1-one and 2-benzyl-2-dimethylamino-1-(4-morpholinophenyl)butane-1-one are preferred because the formed pixel pattern hardly falls off from the substrate at the time of development and the pixel strength and sensitivity are high.

In the present invention, the above compounds having a biimidazole ring, compounds having a benzoin bond, other photoradical generating agents and compounds having a trihalomethyl group may be used alone or in combination of two or more.

In the present invention, the compounds having a biimidazole ring, compounds having a benzoin bond, other photoradical generating agents and compounds having a trihalomethyl group may be further used in combination with at least one selected from the group consisting of a sensitizer, curing promoting agent and crosslinking agent or photosensitizer composed of a polymer compound (to be referred to as "polymer photocrosslinking/sensitizing agent" hereinafter) as required.

Illustrative examples of the sensitizer include 4,4'-bis(dimethylamino)benzophenone, 4,4'-bis(diethylamino)benzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal)cyclohexanone, 7-diethylamino-3-(4-diethylaminobenzoyl)coumarin, 4-(diethylamino)chalcone and the like.

Illustrative examples of the curing promoting agent include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole, 3-mercapto-4-methyl-4H-1,2,4-triazole and the like.

Further, the polymer crosslinking/sensitizing agent is a polymer compound having a functional group, which can function as a photocrosslinking agent and/or photosensitizing agent, in the main chain and/or side chain. Illustrative examples of the polymer crosslinking/sensitizing agent include a condensate of 4-azidobenzaldehyde and polyvinyl alcohol, a condensate of 4-azidobenzaldehyde and phenol novolak resin, homopolymer and copolymer of 4-acryloylphenylcinnamoyl ester, 1,4-polybutadiene, 1,2-polybutadiene and the like.

Of the above sensitizing agents, curing promoting agents and polymer photocrosslinking/sensitizing agents, 4,4'-bis(dimethylamino)benzophenone, 4,4'-bis(diethylamino)benzophenone and 2-mercaptobenzothiazole are preferred because the formed pixel pattern hardly falls off from the substrate at the time of development and the pixel strength and sensitivity are high.

In the present invention, the photopolymerization initiator is particularly preferably used as a combination of at least one biimidazole compound selected from the group consisting of the biimidazole compounds (1) and the biimidazole compounds (2) and at least one member selected from the group consisting of a benzophenone-based compound having a benzoin bond, other benzophenone-based photoradical generating agent, benzophenone-based sensitizer and thiazole-based curing promoting agent.

Particularly preferred examples of the above combination include a combination of 2,2'-bis(2-chlorophenyl)-4,4',5,5'-tetrakis(4-ethoxycarbonylphenyl)biimidazole and 4,4'-bis(diethylamino)benzophenone; a combination of 2,2'-bis(2-chlorophenyl)-4,4',5,5'-tetrakis(4-ethoxycarbonylphenyl)biimidazole, 4,4'-bis(diethylamino)benzophenone and 2-benzyl-2-dimethylamino-1-(4-morpholinophenyl)butane-1-one; a combination of 2,2'-bis(2-chlorophenyl)-4,4',5,5'-tetrakis(4-ethoxycarbonylphenyl)biimidazole, 4,4'-bis(diethylamino)benzophenone and 1-hydroxycyclohexylphenyl ketone; a combination of 2,2'-bis(2-chlorophenyl)-4,4',5,5'-tetrakis(4-ethoxycarbonylphenyl)biimidazole, 4,4'-bis(dimethylamino)benzophenone, 1-hydroxycyclohexylphenyl ketone and 2-mercaptobenzothiazole; a combination of 2,2'-bis(2,4-dichlorophenyl)-4,4',5,5'-tetraphenyl biimidazole and 4,4'-bis(diethylamino)benzophenone; a combination of 2,2'-bis(2,4-dibromophenyl)-4,4',5,5'-tetraphenyl-1,2'-biimidazole, 4,4'-bis(diethylamino)benzophenone and 2-benzyl-2-dimethylamino-1-(4-morpholinophenyl)butane-1-one; a combination of 2,2'-bis(2,4-dibromophenyl)-4,4',5,5'-tetraphenyl biimidazole, 4,4'-bis(diethylamino) benzophenone and 1-hydroxycyclohexylphenyl ketone; and a combination of 2,2'-bis(2,4,6-trichlorophenyl)-4,4',5,5'-tetraphenyl biimidazole, 4,4'-bis(dimethylamino) benzophenone, 1-hydroxycyclohexylphenyl ketone and 2-mercaptobenzothiazole.

In the present invention, the total amount used of the compounds having a benzoin bond, the other photoradical generating agents and the compounds having a trihalomethyl group is preferably 80 wt % or less of the whole amount of the photopolymerization initiator. The total amount used of the sensitizer and the curing promoting agent is preferably 80 wt % or less of the whole amount of the photopolymerization initiator. The amount of the polymer photocrosslinking/sensitizing agent used is preferably 200 parts by weight or less, more preferably 0.01 to 200 parts by weight, particularly preferably 50 to 180 parts by weight, based on 100 parts by weight of the total of the biimidazole compound (1) and the biimidazole compound (2).

The amount of the photopolymerization initiator used in the present invention is preferably 0.01 to 200 parts by weight, more preferably 1 to 120 parts by weight, particularly preferably 1 to 50 parts by weight, based on 100 parts by weight of the carboxyl group-containing polyfunctional monomer (C). When the total amount of the photopolymerization initiator used is less than 0.01 part by weight, curing by exposure to radiation is insufficient with the result that a pixel pattern may be partially or completely lost or undercut. On the other hand, when the amount is more than 200 parts by weight, the formed pixel pattern easily falls off from the substrate at the time of development, and stains or film residues are readily produced in an area other than a portion where pixels are formed.

Additives

The radiation sensitive composition for color filters of the present invention may contain various additives as required.

The additives include, for example, fillers such as glass and alumina; polymer compounds such as polyvinyl alcohols, polyethylene glycol monoalkyl ethers and poly(fluoroalkyl acrylates); surfactants such as nonionic, cationic and anionic surfactants; adhesion promoting agents such as vinyltrimethoxysilane, vinyltriethoxysilane, vinyltris(2-methoxyethoxy)silane, N-(2-aminoethyl)-3-aminopropylmethyl dimethoxy silane, N-(2-aminoethyl)-3-aminopropyl trimethoxy silane, 3-aminopropyl triethoxy silane, 3-glycidoxypropyl trimethoxy silane, 3-glycidoxypropylmethyl dimethoxy silane, 2-(3,4-epoxycyclohexyl)ethyl trimethoxy silane, 3-chloropropylmethyl dimethoxy silane, 3-chloropropyl trimethoxy silane, 3-methacryloxypropyl trimethoxy silane and 3-mercaptopropyl trimethoxy silane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; coagulation preventing agents such as sodium polyacrylate; and the like.

Solvent

The radiation sensitive composition for color filters of the present invention comprises the above components (A), (B), (C) and (D) as essential components and the above additive components as required. All the above components except for the colorant (A) are generally dissolved in an appropriate solvent to prepare a liquid composition.

Any solvents may be suitably selected for use as long as they dissolve or disperse the components (A), (B), (C) and (D) and additive components, do not react with these components and have appropriate volatility.

Illustrative examples of the solvent include (poly)alkylene glycol monoalkyl ethers such as ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, ethylene glycol mono-n-propyl ether acetate, ethylene glycol mono-n-butyl ether acetate, diethylene glycol monomethyl ether acetate, diethylene glycol monoethyl ether acetate, diethylene glycol mono-n-propyl ether acetate, diethylene glycol mono-n-butyl ether acetate, propylene glycol monomethyl ether acetate and propylene glycol monoethyl ether acetate; other ethers such as diethylene glycol dimethyl ether, diethylene glycol methyl ethyl ether, diethylene glycol diethyl ether and tetrahydrofuran; ketones such as methyl ethyl ketone, cyclohexanone, 2-heptanone and 3-heptanone; lactic acid alkyl esters such as methyl 2-hydroxypropionate and ethyl 2-hydroxypropionate; other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-ethoxybutyl acetate, 3-methyl-3-methoxybutyl acetate, 3-methyl-3-methoxybutyl propionate, ethyl acetate, n-propyl acetate, isopropyl acetate, n-butyl acetate, isobutyl acetate, n-amyl acetate, isoamyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate and ethyl 2-oxobutanoate; aromatic hydrocarbons such as toluene and xylene; carboxylic acid amides such as N-methylpyrrolidone, N,N-dimethylformamide, and N,N-dimethylacetoamide; and the like.

These solvents may be used alone or in admixture of two or more.

A high-boiling solvent such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate can be used in combination with the solvent.

These high-boiling solvents may be used alone or in admixture of two or more.

Of the above solvents, ethylene glycol monomethyl ether acetate, ethylene glycol monoethyl ether acetate, ethylene glycol mono-n-butyl ether acetate, propylene glycol monomethyl ether acetate, propylene glycol monoethyl ether acetate, propylene glycol monomethyl ether, diethylene glycol dimethyl ether, diethylene glycol methyl ethyl ether, diethylene glycol n-butyl ethyl acetate, cyclohexanone, 2-heptanone, 3-heptanone, ethyl 2-hydroxypropionate, 3-methoxybutyl acetate, 3-methyl-3-methoxybutyl propionate, ethyl 3-methoxypropionate, methyl 3-ethoxypropionate, ethyl 3-ethoxypropionate, n-butyl acetate, isobutyl acetate, n-amyl acetate, isoamyl acetate, n-butyl propionate, ethyl butyrate, isopropyl butyrate, n-butyl butyrate and ethyl pyruvate are preferred from the viewpoints of solubility, pigment dispersibility and coating properties, and of the high-boiling solvents, r-butyrolactone is preferred.

The amount of the solvent used in the present invention is preferably 100 to 10,000 parts by weight, more preferably 500 to 5,000 parts by weight, based on 100 parts by weight of the binder polymer (B).

Method of forming a color filter

A description is subsequently given of a method of forming a color filter using the radiation sensitive composition of the present invention.

A light screening layer is first formed to define a portion for forming pixels on the surface of a transparent substrate. A liquid radiation sensitive composition having, for example, a red pigment dispersed therein is coated on this substrate and prebaked to evaporate the solvent so as to form a coating film. Thereafter, the coating film is exposed to radiation through a photomask and developed with an alkali developer to dissolve and remove unexposed portions of the coating film to form an array of red pixels arranged in a predetermined pattern.

Thereafter, liquid radiation sensitive compositions having green and blue pigments respectively dispersed therein are coated, prebaked, exposed to radiation and developed in the same manner as described above to form arrays of green pixels and blue pixels on the same substrate in order. Thus, a color filter having arrays of three red, green and blue pixels arranged on the substrate is obtained.

The transparent substrate used to form the color filter is made from glass, silicon, polycarbonate, polyester, aromatic polyamide, polyamideimide, polyimide or the like. The transparent substrate can be subjected to an appropriate pre-treatment such as chemical treatment with a silane coupling agent or the like, plasma treatment, ion plating, sputtering, gas vapor reaction method, vacuum vapor deposition or the like.

To coat the liquid radiation sensitive composition on the transparent substrate, a rotation coating, cast coating, roll coating or the like can be suitably employed.

The thickness of the coating film after drying is preferably 0.1 to 10 μm, more preferably 0.2 to 5.0 μm, particularly preferably 0.2 to 3.0 μm.

The radiation used to form a color filter is selected from visible light, ultraviolet light, far ultraviolet light, electron beams, X-rays and the like. It preferably has a wavelength of 190 to 450 nm.

The irradiation energy of the radiation is preferably 1 to 1,000 mJ/cm$^2$.

The alkali developer is preferably an aqueous solution of sodium carbonate, sodium hydroxide, potassium hydroxide, tetramethyl ammonium hydroxide, choline, 1,8-diazabicyclo-[5.4.0]-7-undecene, 1,5-diazabicyclo-[4.3.0]-5-nonene or the like.

The alkali developer may contain a water-soluble organic solvent such as methanol or ethanol and a surfactant in suitable amounts. After alkali development, the coated film is preferably washed with water.

Development is carried out by a shower development, spray development, dip development, puddle development or the like at normal temperature for 5 to 300 seconds.

The thus formed color filter is extremely useful for color liquid crystal display devices, color image pick-up tube elements, color sensors and the like.

The following examples are given to further illustrate the present invention. However, it should be understood that the present invention is in no way limited by these examples.

COMPARATIVE EXAMPLE 1

100 Parts by weight of carbon black as the component (A), 50 parts by weight of methacrylic acid/benzyl methacrylate/2-hydroxyethyl methacrylate/polystyrene macromonomer copolymer (weight ratio of 60/15/15/10, weight average molecular weight of 25,000) as the component (B), 40 parts by weight of dipentaerythritol pentaacrylate as the component (C), 10 parts by weight of 2,2'-bis(2,4-dichlorophenyl)-4,4',5,5'-tetraphenyl-1,2'-biimidazole, 30 parts by weight of 2-benzyl-2-dimethylamino-1-(4-morpholinophenyl)-butane-1-one, 10 parts by weight of 4,4'-bis(diethylamino)benzophenone and parts by weight of 2-mercaptobenzothiazole as the components (D) and 1,500 parts by weight of ethyl 3-ethoxypropionate as a solvent were mixed together to prepare a liquid radiation sensitive composition.

A light screening layer for defining a portion for forming pixels was formed on the surface of a soda glass transparent substrate having a silica ($SiO_2$) film formed thereon to prevent the elution of sodium ions, and then the above liquid composition was coated on the light screening layer with a spin coater and prebaked at 90° C. for 4 minutes to form a 1.3 μm thick coating film.

Thereafter, the substrate was cooled to a room temperature and exposed to 200 mJ/cm$^2$ of ultraviolet light having a wavelength of 365 nm through a photomask using a high-pressure mercury lamp. The substrate was then immersed in a 0.04 wt % aqueous solution of potassium hydroxide heated at 23° C. for 1 minute, developed, washed with ultra-pure water and dried with air. Thereafter, the resulting film was post-baked at 270° C. for 30 minutes to produce a black matrix having a black pixel pattern with a line width of 20 μm formed on the substrate.

This black matrix had a line width which was 110 to 120% of the designed line width and a partial or complete loss of a pattern was observed. When a peel test was made on this black matrix using an adhesive tape, the pattern peeled off. In addition, undissolved portions (residues) of the composition remained in an unexposed portion and a scum was observed on the pattern.

EXAMPLE 1

100 Parts by weight of carbon black as the component (A), 50 parts by weight of methacrylic acid/benzyl methacrylate/2-hydroxyethyl methacrylate/polystyrene macromonomer copolymer (weight ratio of 60/15/15/10, weight average molecular weight of 25,000) as the component (B), 30 parts by weight of a carboxyl group-containing polyfunctional monomer (cl) and 40 parts by weight of dipentaerythritol pentaacrylate as the components (C), 10 parts by weight of 2,2'-bis(2,4-dichlorophenyl)-4,4',5'5'-tetraphenyl-1,2'-biimidazole, 30 parts by weight of 2-benzyl-2-dimethylamino-1-(4-morpholinophenyl)butane-1-one, 10 parts by weight of 4,4'-bis(diethylamino) benzophenone and 5 parts by weight of 2-mercaptobenzothiazole as the components (D) and 1,500 parts by weight of ethyl 3-ethoxypropionate as a solvent were mixed together to prepare a liquid radiation sensitive composition.

Using this liquid composition, a black matrix was produced in the same manner as in Comparative Example 1.

This black matrix had a line width of 20 μm which coincided with the designed size and a partial or complete loss of a pattern was not observed. When a peel test was made on the obtained black matrix using an adhesive tape, the pattern did not peel off. In addition, undissolved portions (residues) of the composition did not remain in an exposed portion or a scum was not produced on the pattern.

The radiation sensitive composition for color filters of the present invention is capable of forming a high-resolution pixel array having excellent adhesion strength to a substrate at a high yield without having undissolved portions (residues) of the composition remaining in an unexposed portion or scum produced on a pixel even when a fine pixel array is to be formed.

What is claimed is:

1. A radiation sensitive composition comprising:
   (A) a colorant;
   (B) a binder polymer;
   (C) at least one esterified product selected from a the group consisting of (c-1) a free carboxyl group-containing monoesterified product of pentaerythritoltrimethacrylate or pentaerythritoltriacrylate and succinic acid and (c-2) a free carboxyl group-containing oligoesterified product of a tricarboxylic acid and a monohydroxymonomethacrylate or monohvdroxymonoacrylate; and
   (D) a photopolymerization initiator.

2. The radiation sensitive composition of claim 1, wherein the colorant (A) is an organic pigment and/or carbon black.

3. The radiation sensitive composition of claim 1, wherein the binder polymer (B) is a polymer having an acid functional group.

4. The radiation sensitive composition of claim 1, wherein the binder polymer (B) is a copolymer of an ethylenically unsaturated monomer having at least one carboxyl group in a molecule and other ethylenically unsaturated monomer copolymerizable with the monomer.

5. The radiation sensitive composition of claim 1, wherein the binder polymer (B) is a copolymer of at least one monomer selected from the group consisting of acrylic acid and methacrylic acid and at least one monomer selected from the group consisting of methyl methacrylate, 2-hydroxyethyl (meth)acrylate, benzyl (meth)acrylate, styrene, N-phenylmaleimide, polystyrene macromonomer and polymethyl methacrylate macromonomer.

6. The radiation sensitive composition of claim 1, wherein the binder polymer (B) is at least one copolymer selected from the group consisting of methacrylic acid/benzyl methacrylate copolymer; methacrylic acid/benzyl methacrylate/ styrene copolymer; methacrylic acid/methyl methacrylate/ styrene copolymer; methacrylic acid/benzyl methacrylate/ polystyrene macromonomer copolymer; methacrylic acid/ benzyl methacrylate/polymethyl methacrylate macromonomer copolymer; methacrylic acid/methyl methacrylate/polystyrene macromonomer copolymer; methacrylic acid/methyl methacrylate/polymethyl methacrylate macromonomer copolymer; methacrylic acid/2-hydroxyethyl methacrylate/benzyl methacrylate/polystyrene macromonomer copolymer; methacrylic acid/2-hydroxyethyl methacrylate/benzyl methacrylate/polymethyl methacrylate macromonomer copolymer; N-phenylmaleimide/methacrylic acid/styrene/benzyl methacrylate copolymer; N-phenylmaleimide/methacrylic acid/styrene/phenyl methacrylate copolymer; N-phenylmaleimide/methacrylic acid/styrene/benzyl methacrylate/polystyrene macromonomer copolymer; N-phenylmaleimide/methacrylic acid/styrene/benzyl methacrylate/polymethyl methacrylate macromonomer copolymer; N-phenylmaleimide/methacrylic acid/styrene/ phenyl methacrylate/polystyrene macromonomer copolymer; N-phenylmaleimide/methacrylic acid/styrene/phenyl methacrylate/polymethyl methacrylate macromonomer copolymer; N-phenylmaleimide/methacrylic acid/styrene/2-hydroxyethyl methacrylate/benzyl methacrylate/polystyrene macromonomer copolymer; N-phenylmaleimide, methacrylic acid/styrene/2-hydroxyethyl methacrylate/benzyl methacrylate/polymethyl methacrylate macromonomer copolymer; N-phenylmaleimide/methacrylic acid/styrene/2-hydroxyethyl methacrylate/phenyl methacrylate/polystyrene macromonomer copolymer; and N-phenylmaleimide/ methacrylic acid/styrene/2-hydroxyethyl methacrylate/ phenyl methacrylate/polymethyl methacrylate macromonomer copolymer.

7. The radiation sensitive composition of claim 1, wherein the binder polymer (B) is contained in an amount of 10 to 1,000 parts by weight, based on 100 parts by weight of the colorant (A).

8. The radiation sensitive composition of claim 1, wherein the esterified product (C) is contained in an amount of 5 to 500 parts by weight, based on 100 parts by weight of the binder polymer (B).

9. The radiation sensitive composition of claim 1, wherein the photopolymerization initiator (D) comprises a biimidazole compound.

10. The radiation sensitive composition of claim 9, wherein the biimidazole compound is at least one selected from the group consisting of 2,2'-bis(2,4-dichlorophenyl)-4, 4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-trichlorophenyl)-4,4',5,5'-tetraphenyl-1,2'-biimidazole and 2,2'-bis(2,4,6-tribromophenyl)-4,4',5,5'-tetraphenyl-1,2'-biimidazole.

11. The radiation sensitive composition of claim 1, wherein the photopolymerization initiator (D) contains a biimidazole compound and at least one member selected from the group consisting of a compound having a benzoin bond, a benzophenone-based other photoradical generating agent, a benzophenone-based sensitizer and a thiazole-based curing promoting agent.

12. The radiation sensitive composition of claim 1, wherein the photopolymerization initiator (D) is contained in an amount of 0.01 to 200 parts by weight based on 100 parts by weight of the binder polymer (B).

13. A color filter comprising a cured product obtained by exposure of a radiation sensitive composition to a radiation, the radiation sensitive composition comprising:
(A) a colorant;
(B) a binder polymer;
(C) at least one esterified product selected from a the group consisting of (c-1) a free carboxyl group-containing monoesterified product of pentaerythritoltrimethacrylate or pentaerythritoltriacrylate and succinic acid and (c-2) a free carboxyl group-containing oligoesterified product of a tricarboxylic acid and a monohydroxymonomethacrylate or monohydroxymonoacrylate; and
(D) a photopolymerization initiator.

* * * * *